(12) United States Patent
Sahrling

(10) Patent No.: US 8,019,561 B1
(45) Date of Patent: Sep. 13, 2011

(54) ELECTRICAL SHORT LOCATOR METHOD

(75) Inventor: Mikael Bo Lennart Sahrling, Kamuela, HI (US)

(73) Assignee: VerIC Systems LLC, Kamuela, HI (US)

( * ) Notice: Subject to any disclaimer, the term of this patent is extended or adjusted under 35 U.S.C. 154(b) by 547 days.

(21) Appl. No.: 12/202,297

(22) Filed: Aug. 31, 2008

Related U.S. Application Data (60) Provisional application No. 60/969,654, filed on Sep. 3, 2007.

(51) Int. Cl.
*G01R 31/00* (2006.01)
(52) U.S. Cl. .............. 702/59; 716/52; 716/55; 716/111; 716/112; 716/113; 716/115; 716/122; 716/139
(58) Field of Classification Search .................... 702/59; 716/112, 113, 103, 111, 123, 124, 119, 52, 716/55, 115, 139, 122
See application file for complete search history.

(56) References Cited

U.S. PATENT DOCUMENTS

| | | | | |
|---|---|---|---|---|
| 5,050,091 | A | * | 9/1991 | Rubin ............................. 716/122 |
| 5,062,054 | A | * | 10/1991 | Kawakami et al. ............. 716/112 |
| 5,299,139 | A | * | 3/1994 | Baisuck et al. ................. 716/112 |
| 5,613,102 | A | * | 3/1997 | Chiang et al. .................... 716/52 |
| 5,999,726 | A | * | 12/1999 | Ho .................................. 716/112 |
| 6,128,768 | A | * | 10/2000 | Ho .................................. 716/115 |
| 6,167,555 | A | * | 12/2000 | Lakos .............................. 716/55 |
| 6,421,814 | B1 | * | 7/2002 | Ho .................................. 716/113 |
| 6,438,729 | B1 | * | 8/2002 | Ho .................................. 716/113 |
| 6,882,173 | B1 | | 4/2005 | Nelson et al. |
| 6,911,838 | B2 | | 6/2005 | Rao et al. |
| 7,411,404 | B2 | | 8/2008 | Rai |
| 2007/0245275 | A1 | * | 10/2007 | Jandhyala et al. ................ 716/4 |
| 2009/0031261 | A1 | * | 1/2009 | Smith et al. ....................... 716/2 |

* cited by examiner

*Primary Examiner* — Carol Tsai (57) ABSTRACT

A method for locating electrical shorts in layout designs by either systematically removing subcells in the layout hierarchy or, if the shorts are not found in any of the subcells, iteratively excluding portions of the top level layout from the electrical connectivity analysis and thereby locate the shorting polygons. Shorts existing both in subcells and the top level will be found by applying the method repeatedly until all shorts are located and eliminated.

10 Claims, 10 Drawing Sheets

Figure 1

Toplevel layout

ELECTRICAL SHORT LOCATOR METHOD

The present invention relates to error detection schemes for integrated circuit (IC) layout, and more particularly the method and apparatus for detecting layout design errors that constitute a "short circuit" error in which the layouts of polygons, or other geometrical shapes hereinafter referred to as simply polygons, representing conductive materials touch in places where they should not touch, thereby creating unwanted electrical connections between circuit elements.

BACKGROUND OF THE INNOVATION

Prior Art

When "circuit extraction" programs are applied to an IC layout design database, the result is a representation of the electrical circuit which would result from committing that layout design to a mask set and fabricating integrated circuit chips using that mask set. While their internal representations differ, all circuit extraction programs must, at one point, determine all disjoint sets of polygons representing areas of equipotential in the final, fabricated IC, i.e. they must determine all electrical nodes represented in the design database.

If polygons representing the same conductive material touch or overlap each other, then they represent an electrical node. Similarly, if polygons representing different conductive materials are shown to be "connected" by either proximity or so-called "contact" materials, then they, too, represent an electrical node. The polygons that comprise an electrical node may be formed or represented for analysis purposes in any one of several ways that are commonly known in the art. The procedure with which polygons are determined to belong to a certain electrical node is below called performing "a(n) (electrical) connectivity analysis". Incorrect placement of conductive or contact materials result in the connection of one node to another, and if only geometric information is available to the programs analyzing the layout information, then it is typically not possible to precisely locate the position of the incorrectly placed polygon(s).

Certain known software routines that are commercially available assist in identifying layout errors causing electrical nodes to be incorrectly connected. In one software routine the shortest conductive path is formed between two points (on an electrical node) selected by the user from the "extracted network". This path is displayed, and the task of the user is to determine the incorrect polygon(s) which caused the points to connect. The conventional program determines all paths (shorts) among the different nodes identified by the user. They may all be displayed simultaneously or in the order of increasing "length" (that is the number of polygons or trapezoids comprising them). Another known software routine "prunes" from the extracted node under analysis (the "problem node") all non-ambiguous branches. The remaining area is (in trivial cases) sufficiently simple for the user to determine the cause of the short. If not, then the user may enter additional points of correspondence to further reduce the ambiguity of the problem node in the manner previously described.

One disadvantage encountered with each of the aforementioned programs is that insufficient information is provided to the user to quickly "home-in" on the error, unless the node is extremely simple, or unless the user's placement of known nodal points is fortuitous. Another difficulty encountered is that these known programs do not deal effectively with the typical case in which multiple nodes are shorted in multiple locations, and the only points easily available to the user are at or near the connection pads of the chip. Nodes such as those delivering power to a chip, or clock lines, or ground, can be extremely large and complex, comprising thousands, hundreds of thousands, or millions of individual polygons. Two or more of such nodes may be shorted together in more than one place exacerbating the problem. Indeed, any of a number of nodes may have inadvertently been shorted together in any number of places, thus creating a problem that is difficult to solve without a major advancement in analysis techniques.

A more recent development is the method suggested by Baisuck et al. U.S. Pat. No. 5,299,139 Mar. 29, 1994. Here, the problem of finding shorting polygons is solved by tracing the node in question multiple times using different reference or "correspondence point" information associated with different circuit nodes (typically supplied by a user) during each tracing of the network, and retains what it derives from each tracing. As the tracings are performed, the derived information is combined, and at the end of all tracings, a display is produced for the user which separates the "known" from the "ambiguous" parts of the problem node. The nodal network is traversed in one of three modes; namely: "search", "success", or "failure" modes, and a marker is left in each polygon "visited" to indicate the mode the system was in when the visit occurred. During the traversal, which starts at each of the corresponding points whose nodal identity is supplied by the user, the method "searches" for "success" or "failure". "Success" means that another polygon marked with the same identification as the mark of the starting point has been found. "Failure" means that a polygon has been found with a mark different from that of the starting point has been found along the same node. When the entire problem node has been traversed from all instances of the first node-identifier supplied by the user, the mode markings for each polygon in the node are not discarded. Rather the traversal for the next identified node is performed and the node markings are combined with the existing ones. This way, nodes marked with "success" has a chance of belonging to a unique node and the ones marked "failure" can be questionable and should be investigated by the user. The problem with the method is there is no way to control the traversing of nodes. The method can take any path starting out from a given user supplied polygon with a known node identity. One then has to make sure all paths from a given starting point are explored. This can quickly get completely out of hand, in particular if there are many user supplied nodes. Furthermore, there is no way to be certain the "failure" polygons are truly ambiguous, it is highly dependent on the particular way in which the method searches the polygons. In the end, the user can easily be left with a massive number of "failure" polygons which can be just as hard to analyze as the original problem.

The problem of finding shorts in electrical systems has also received recent attention in Rai U.S. Pat. No. 7,411,404 B2 Aug. 12, 2008. Here a method is described that finds electrical shorts in a dynamoelectric machine by predicting and measuring, among other entities, electrical currents. Also Nelson et el. U.S. Pat. No. 6,882,173 B1 and Rao et al U.S. Pat. No. 6,911,838 B2 discusses several methods of finding shorts in an electric generator using magnetic flux density and inductance measurements. They thus concern themselves with a completely different area of finding shorts, where actual measurements can be performed on already built motors and generators, than the present invention.

Ho U.S. Pat. No. 6,438,729 August 2002, U.S. Pat. No. 6,421,814 August 2002, U.S. Pat. No. 6,128,768 October 2000, U.S. Pat. No. 5,999,726 December 1999, discloses a layout parasitics extraction system using a connectivity based approach to permit net-by-net extraction of layout parasitics.

Lakos, U.S. Pat. No. 6,167,555 December 2000, discloses a system for converting a polygon-based wire in an integrated circuit to an object-based wire element.

Chiang et al U.S. Pat. No. 5,613,102 March 1997, disclose a method of compressing data used in integrated circuit (IC) layout verifications including the steps of identifying each circuit component from each layer of the IC chip; sorting each circuit component in an established order; identifying predetermined parameters for each component; determining the difference in values of the parameters for each pair of components in successive order; and storing the difference values for each pair of components.

Kawakami et al U.S. Pat. No. 5,062,054 October 1991, disclose a printed circuit layout system using two or more of the following sub-systems: a pattern processing subsystem, a pattern design rule check subsystem, and a pattern connectivity verification characterizes any circuit pattern by a set of rectangles, each rectangle identified by a potential number and a layer, number and coordinates, and identifies terminals by potential number, layer number, and terminal names.

Rubin U.S. Pat. No. 5,050,091 September 1991, discloses an electrical design system being described which integrates many analysis and synthesis tools in an environment of top-down circuit layout.

Smith et al U.S. 2009/0031261 January 2009, disclose a method and system being described to reduce process variation as a result of the semiconductor processing of films in integrated circuit manufacturing processes.

Andhyala et al U.S. 2007/0245275 October 2007, disclose a method and system to efficiently create electromagnetic coupled basis functions for an electronic circuit that is defined by geometry data and topology data.

BACKGROUND OF INVENTION

Objects and Advantages

Figure 2:
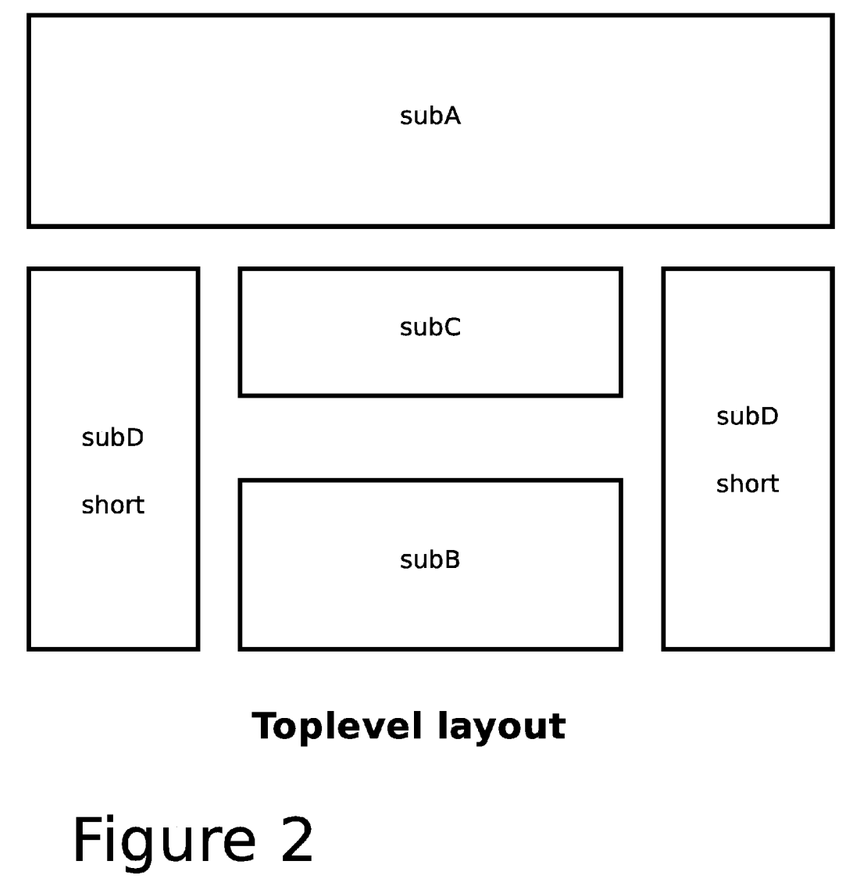
FIG. 2. shows an example of a layout with subcells.

Modern layouts are often hierarchical in nature. This means that a layout can consist of not only polygons but also other separate layouts referred to as "subcells". These subcells in turn can contain other subcells and polygons. This way a hierarchy of subcells can be constructed and one subcell can be used many times. The top most level is often referred to as the top-level layout, FIG. 2. The advantage is that an often used subcell only has to be made once and can then be reused again and again. If a short appears in one of these subcells it can show up as many shorts on the toplevel. Shorts in hierarchical layouts can be handled in many different ways. One way would be to flatten all subcells, a technique in which all polygons within a subcell is placed directly in the toplevel cell of the hierarchy. This way no hierarchy longer exists and one can proceed with investigating the shorts among the polygons. This can be very inefficient and at present the preferred way to handle shorts in hierarchical layouts is to first exclude all subcells in the top level layout and investigating if the short is still present. If it is, one short is found among the toplevel polygons. If not, some of the subcells are causing the short.

If the short is found among the polygons, the present invention uses a completely different approach to the problem compared with the prior art methods. To understand this remember a short is simply a portion of the chip where an unwanted connection between separate nodes occur. If one excludes this region(s) from the connectivity analysis of the polygons, the nodes will not be shorted. One can utilize this property of shorts by defining one or more "exclusion regions", inside of which no interaction between polygons are investigated, and moving these regions systematically all over the chip to find the locations of the shorts. To be able to do this efficiently one can do this iteratively where the exclusion regions are large in the first iteration and then as the approximate shorts locations are found one can, in the next iteration, subdivide the exclusion regions from the previous iteration. This continues until the size of the exclusion region is smaller than some predefined value or the size cannot be reduced further.

If the short is found among the subcells the method will systematically remove/replace the subcells until the offending one(s) are found.

SUMMARY

An invention is presented which locates shorts in layout designs by either systematically removing subcells in the layout hierarchy or, if the shorts are not found in any of the subcells, iteratively excluding portions of the layout from the electrical connectivity analysis and thereby locate the shorting polygons. Shorts existing both in subcells and the polygons will be found by applying the method repeatedly until all shorts are located and eliminated.

DRAWINGS

Figures

DETAILED DESCRIPTION OF THE INVENTION

General System Configuration

Figure 1:
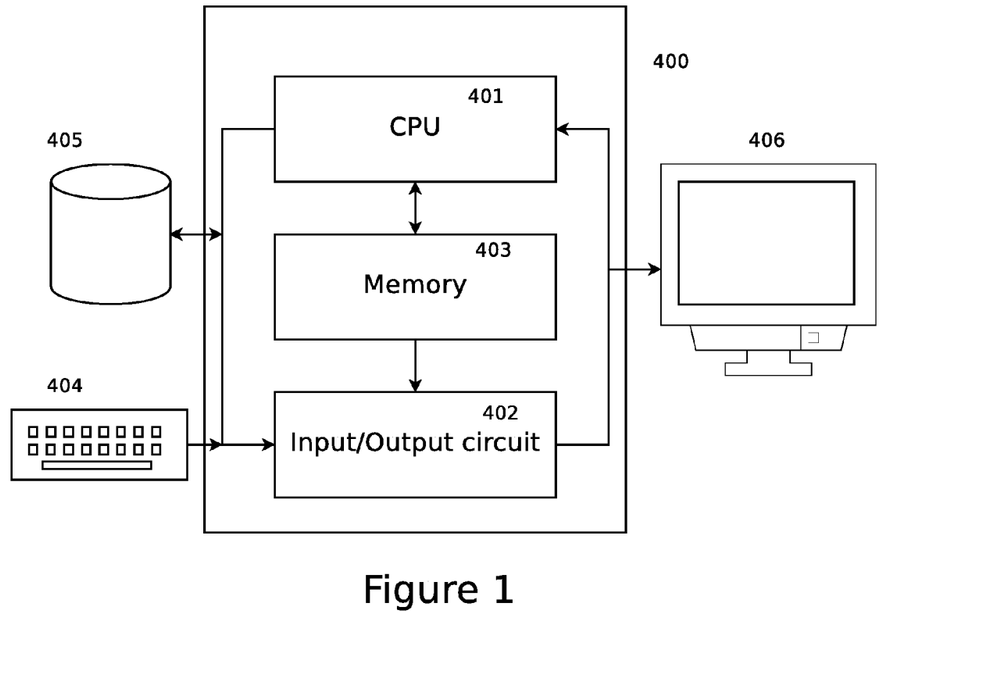
FIG. 1. shows a typical computer system.

A typical computer system used to implement the process described herein can be found in FIG. 1. It consists of a computer core 400 and peripheral units 404, 405, and 406. The computer core itself 400 is made up of a central processing unit (CPU) 401, an input/output circuit 402 to handle communication between all parts of the computer system, and a memory 403 for storing intermediate computational results. All these elements are intended to be representative of a broad category of data processors, such as Personal Computers (PC's), mini computers and super computers to name a few.

The peripheral unit 404 is intended to represent an input device, here depicted as a keyboard connected to the computer cores input/output circuit.

It can, of course, be anything from a keyboard and cursor control (mouse) to magnetic devices such as hard drives/tape drives and other such well-known devices. The peripheral unit 405 is intended to represent external mass memory storage such as magnetic hard drives/tape drives, electronic memory and other familiar devices. The remaining peripheral unit 406 is a display for communicating with a user and can be a monitor, printer or other similar devices.

DETAILED DESCRIPTION OF THE INVENTION

Process Description

Figure 3A:
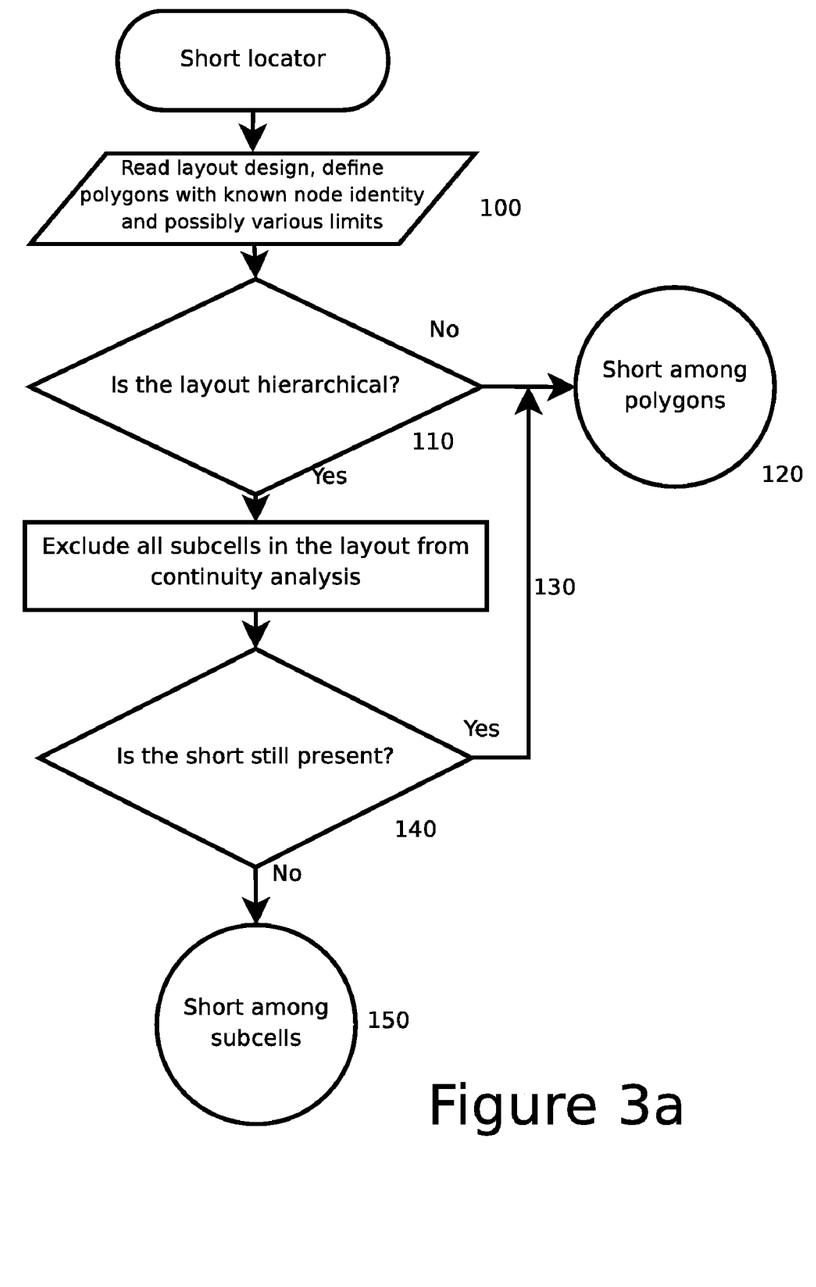
FIG. 3a-c. shows a flow chart of the invention.

FIG. 3a shows a flow chart with the steps involved in this invention. First, the layout data base is read into the computer system by any means available 100. Here the user also defines polygons with known node identity and possibly various size limits needed later, like minimum size of the exclusion regions and maximum number of iterations allowed. This can be done in many ways, from reading polygon location and type from a text file to interactive input via a graphical interface which is the preferred way at present. Next, the method investigates the layout database for the existence of an hierarchical structure 110. If one is not found the method proceeds by investigating the polygons for a short 120. If there is an hierarchical structure, the method proceeds by excluding all the subcells from the connectivity analysis, which now only investigates the polygons in the top level 130. If the short is present 140 the method continues by investigating the polygons for a short 120. If there is no short 140 the method will investigate the subcells for shorts 150.

Figure 3B:
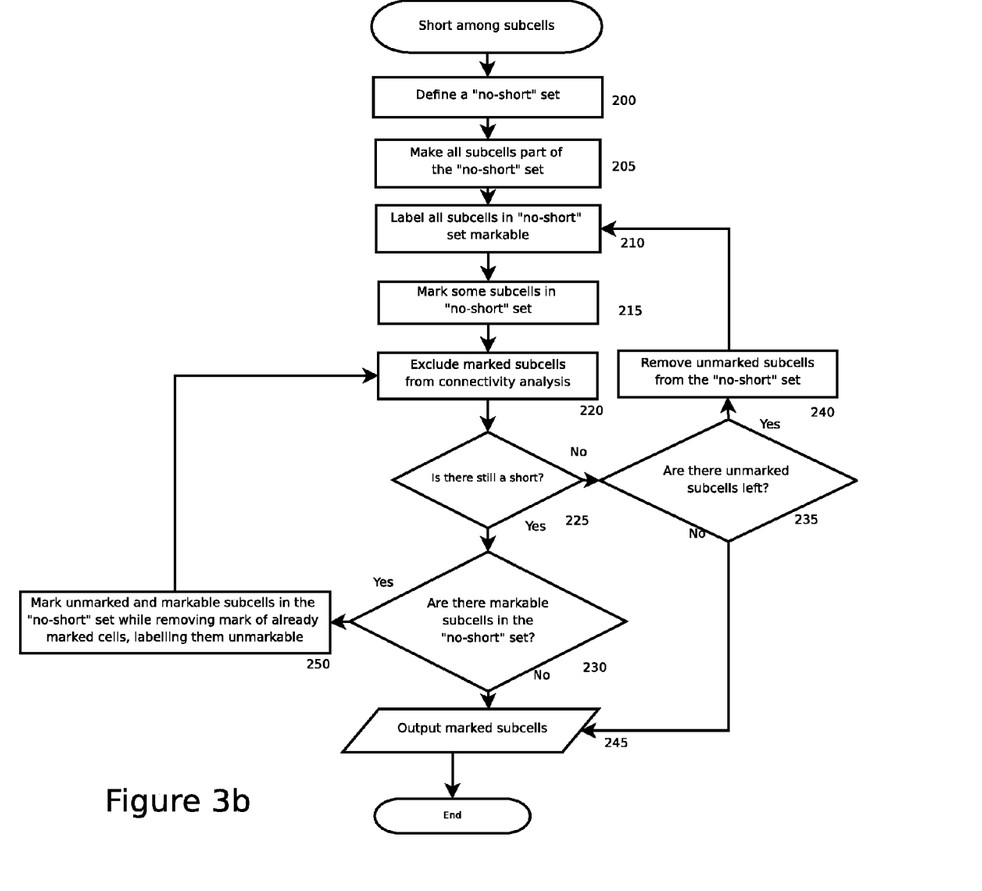

FIG. 3b shows a flow chart where the steps involved in investigating the subcells for shorts are shown. First, a "no-short" set is defined 200, where initially all subcells are placed 205 since we know the short disappears when all subcells are excluded from the connectivity analysis 140. Next, all subcells in the "no-short" set are labeled as markable 210, simply meaning they can be marked for exclusion in the connectivity analysis. There are many ways to select the cells to be marked for exclusion, such as taking one or a small group of subcells at a time. At present, the preferred way is to mark half of the cells in the "no-short" set for exclusion 215. The connectivity analysis of the node is now done 220. If the short disappears 225 the unmarked subcells in the "no_short" set, if there are any 235, are removed from the "no_short" set 240. The method now marks all subcells in the "no-short" set as "markable" 210 and removes the mark on half, the presently preferred number, of the remaining subcells in the "no-short" set 215 and continues the connectivity analysis 220. If the short does not disappear 225 the unmarked cells in the "no-short" set, if there are any 230, are marked if they are labeled as "markable" and the already marked ones have their mark removed and are labeled as "unmarkable" 250. If the unmarked cells are labeled "unmarkable" the method exits with the existing "no-short" set as the result 245. Remember, the cells in the "no-short" set will always remove the short since only subcells that do not cause to the short are ever removed from the "no-short" set with this invention. Also recall initially, the short is removed when all subcells are in this set.

Figure 3C:
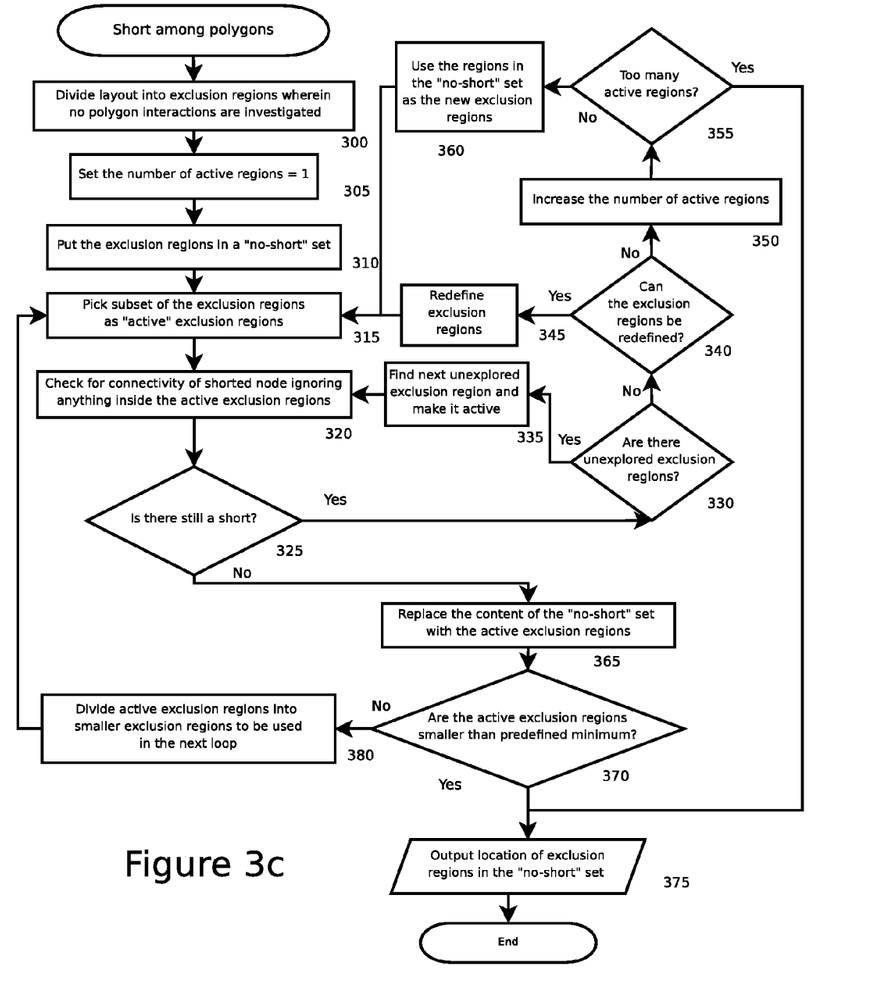

FIG. 3c shows a flow chart with the steps involved in determining the short among polygons with this invention. To better understand this method let us first describe the overall procedure and then go over the details. The layout is divided into a number of so called "exclusion regions". These are smaller non-overlapping sections of the layout. At any given time a number of these regions are "active" which means that within them, all interactions between polygons; touchings, overlappings and so on, are ignored. Initially only one exclusion region at a time is active and if the short is not found the number of active exclusion regions increase because it is likely more than one short are present. To help keep track of which exclusion region(s) that remove the short a "no-short" set is defined containing the short-removing regions. The details of the invention follows. First, the layout is divided into exclusion regions 300. The preferred way to do this but by no means the only way, is to divide the layout into roughly equal size rectangles. The number of active exclusion regions to use is set to one, the presently preferred number 305. These exclusion regions are made part of a "no-short" set 310. This can be done in many ways from using a bit in the internal representation of the polygon to mark it as belonging to the "no-short" set or link all polygons in the "no-short" set together, methods all known to people skilled in this art. At present, the preferred way is to link the polygons in the "no-short" set together since that often will be faster. The method now picks a subset of the exclusion regions 315 to be active exclusion regions and ignores all interactions within them. This can be done in several different ways from a random picking to a systematic ordering of the regions. The preferred way is to number the regions from 1 and up to the total number of regions and choose active ones starting from region 1 and up. If there are more than one active region the preferred way is to loop through them in such a way that all combinations of active regions are investigated only once. This is a common technique known to people skilled in this art. Following this the method performs an electrical connectivity analysis of the shorted node 320, ignoring anything inside the active exclusion regions. Next, the method decides if the short disappears 325. There are many ways to decide this. One way would be to make sure all polygons with a particular node identity are connected. This is the least uncertain way to decide if the short is present. Another way, which in practice turns out to be sufficient most of the time and is the currently preferred way, is to make sure one of the user defined nodes have all user defined polygons connected and all of the other user defined nodes/polygons are disconnected from the node in question and each other. If the short disappears 325, the method replaces the content of the "no-short" set with the currently active exclusion regions 365, and investigates if the size of the exclusion regions are smaller than a predefined limit 370. This way the "no-short" set will always contain the exclusion regions that remove the short. If so, the invention outputs the location and size of the active exclusion regions 375. These represent the locations of the shorts. If the exclusion regions are greater than a predefined limit 370, the active exclusion regions are subdivided into smaller ones 380, at present four roughly equal rectangles are preferred and the process repeats 315. If the short does not disappear 325, the invention looks for exclusion regions that have not been active 330 and if such are found picks a subset of them to become active exclusion regions 335. If there are no more unexplored exclusion regions the method will first investigate if it is possible 340 to redefine the exclusion regions, either by determining if they are larger than an already predefined minimum limit or the number of permutations/iteration is below some predefined maximum limit, limits entered by the user earlier 100. One can redefine the regions in many different ways for example using an offset such that the borders of the new exclusion regions do not overlap with the old ones or making them into unequal sizes depending on underlying layout or simply subdivide the old regions into smaller ones. At present the preferred way is to cut each exclusion region into roughly four equal regions. If redefinition is possible the exclusion regions will be redefined 345. If it is not possible 340 the method will increase the number of active exclusion regions used at a time 350 and if they are less than a predefined number 100, start over by using the exclusion regions in the "no-short" set as a starting point 360. If the number of active regions is greater than the set limit 355 the method will output the location and size of the active exclusion regions 370 and exit.

At this point, a couple of examples can prove useful. First we consider what happens when the short can be found among polygons. Next, we will see an example of a layout with a short in a subcell.

Figure 4A:
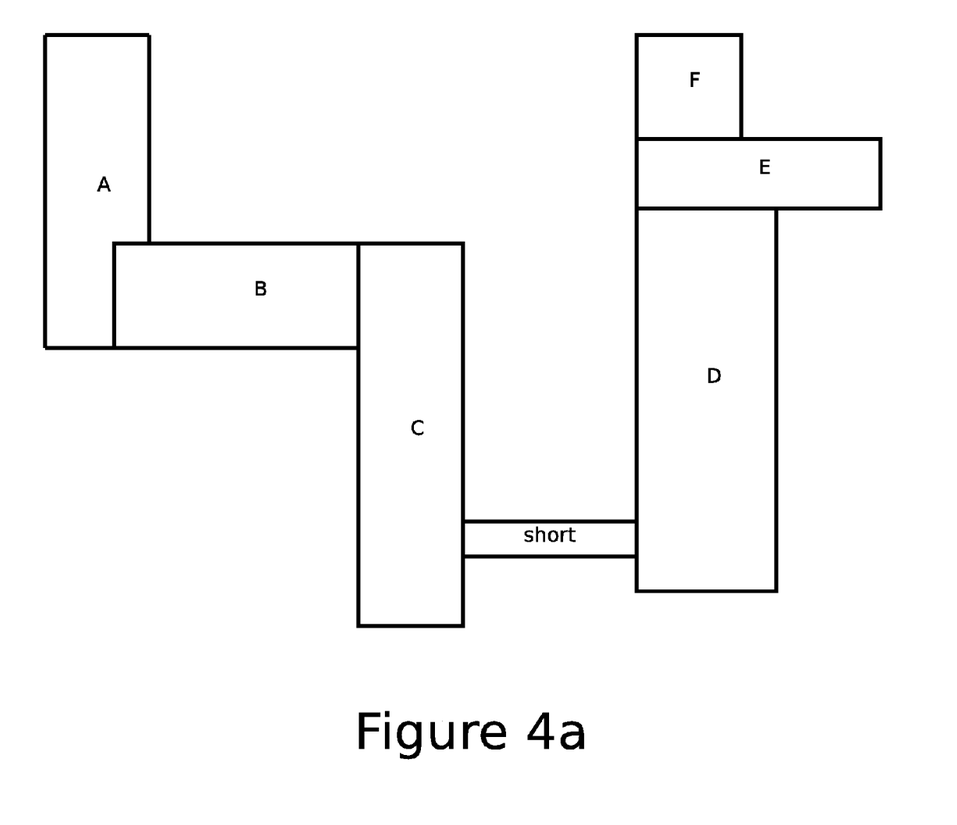
FIG. 4a-e. illustrates an example of a layout with polygons.
Figure 4B:
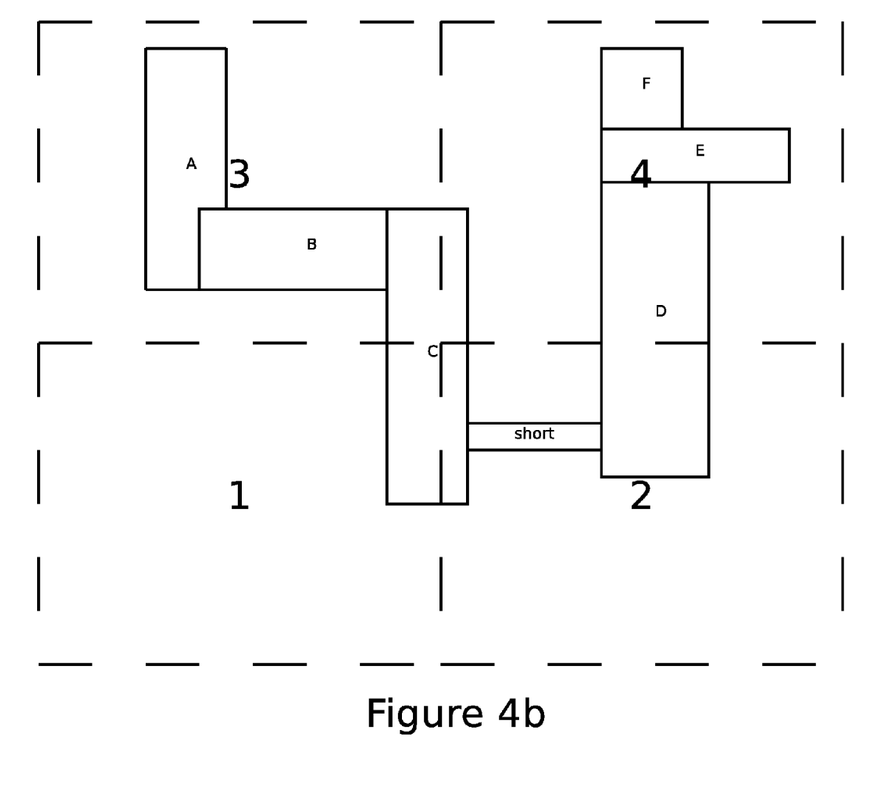
Figure 4C:
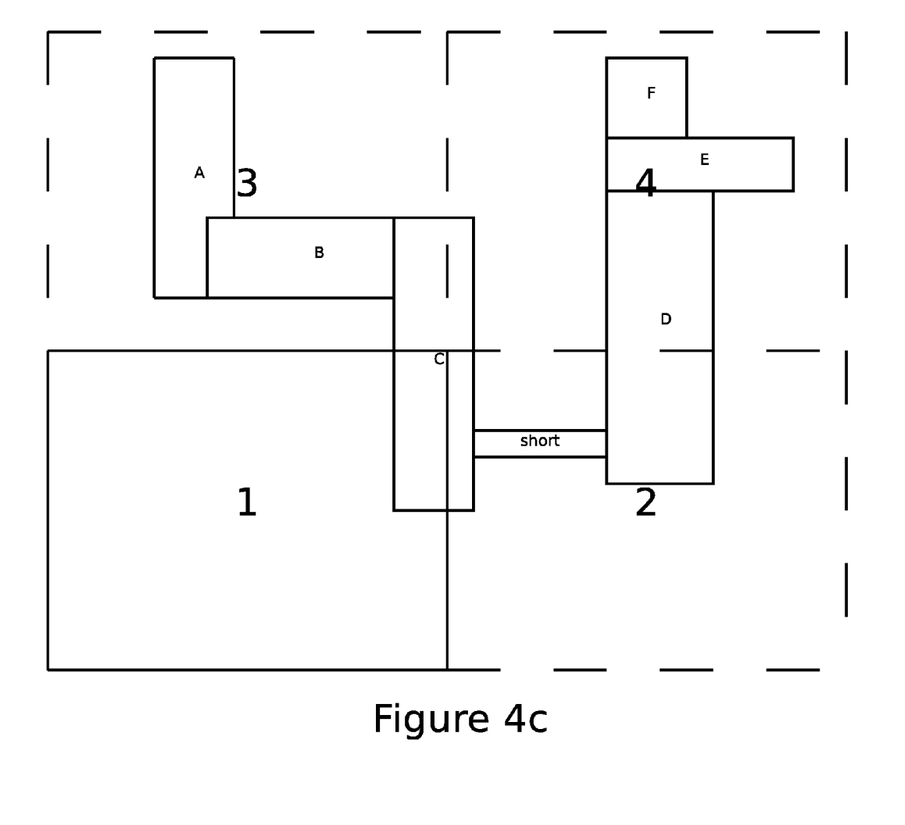
Figure 4D:
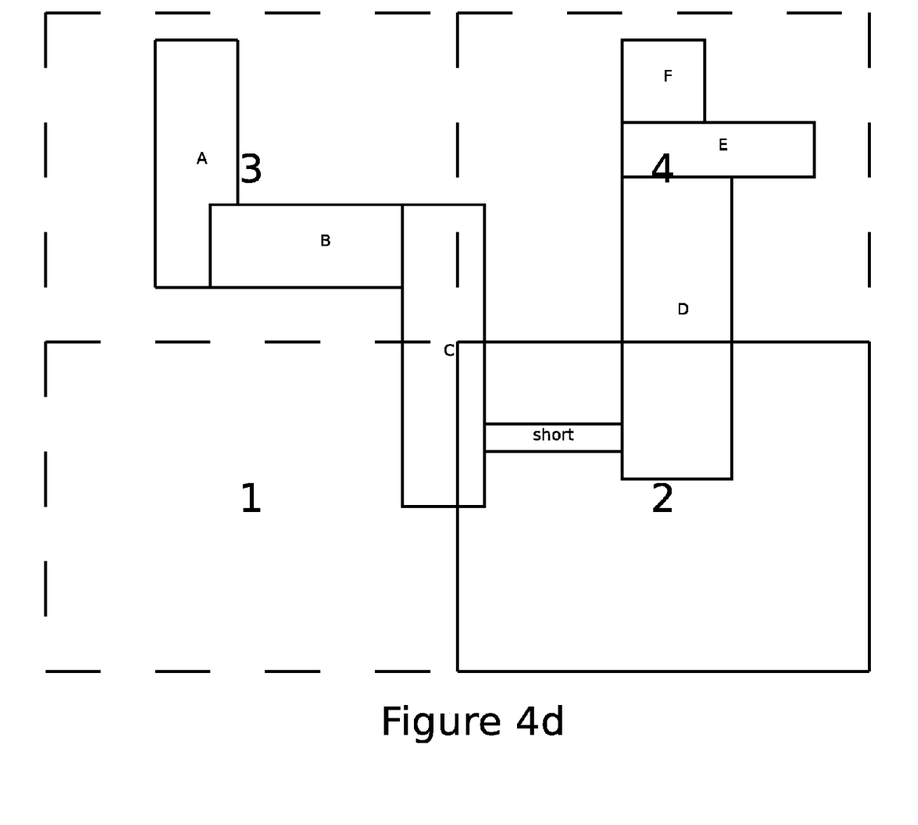
Figure 4E:
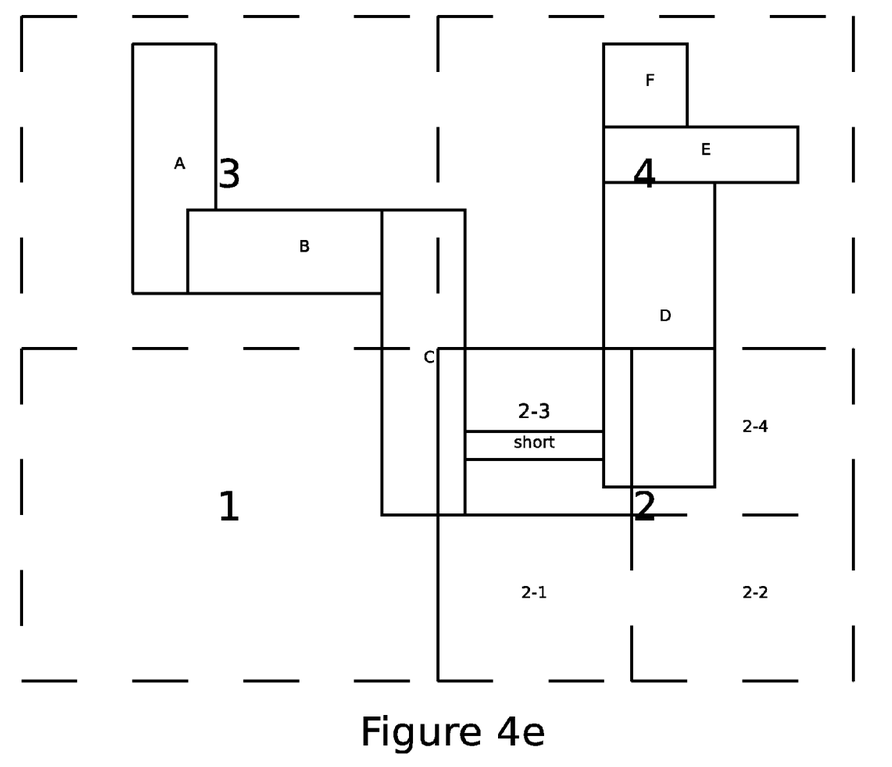

FIG. 4a shows a set of polygons where the polygon labeled "short" shorts two separate nodes. First the user defines polygon "A" and "C" as belonging to node "node1" and polygons "D" and "F" belongs to node "node2". The method now looks for subcells in the layout and since this layout contains polygons only it investigates the short among the polygons. Now, the method defines the exclusion regions as in FIG. 4b. These exclusion regions are made part of the "no-short" set. Next, the method defines exclusion region 1 as the active exclusion region, FIG. 4c. All interactions between polygons within this region is ignored. As can be seen from FIG. 4c, this exclusion region does not remove the short, polygons "A" and "C" are connected to polygons "D" and "F" via polygon "short". Next, the method selects exclusion region 2 as the active one. This exclusion region overlaps the polygon "short", see FIG. 4d. All interactions within the active exclusion region are ignored and polygons "A" and "C" are connected via polygon "B" and they are disconnected from polygons "D" and "F" which are connected through polygon "E". With exclusion region 2 the short is found and the method will now update the "no-short" set to contain only exclusion region 2 then subdivide this exclusion region into smaller ones and continue. It should be clear from FIG. 4e that exclusion region 2-3 is the one covering polygon "short" and the method will replace the content of the "no-short" set to contain only region 2-3. The method will now, depending on the minimum size limit input by the user, either attempt to subdivide this exclusion region further or exit and output the content of the "no-short" set, exclusion region 2-3, as the location of the short. Note that the final exclusion region can be smaller than the polygon labeled "short". In fact an exclusion region only covering the area where polygon "C" and "short" (or "D" and "short") touch is perfectly valid. The case where there are more than one short present can now be simply examined by using more than one active exclusion region at a time.

We will now examine what happens when the short is found within the subcells. As described above FIG. 2 shows an example of a layout containing subcells. For simplicity, the top level polygons are not displayed. As can be seen from FIG. 2 these subcells are called subA, subB, subC, and subD. The layout contains two copies, or what is sometimes called instantiations, of subcell subD which contains the short in this example. Let us examine what happens when the present invention investigates this layout. We assume for simplicity that none of the subcells break the continuity of the shorted node. First, the layout is read into the computer system. Then the layout is examined for the existence of subcells making it hierarchical. In our example the layout is clearly hierarchical so the method continues by excluding all subcells from the connectivity analysis. Since the short is present in subcell subD this will remove the short from the node in question and the method continues to examine the short among subcells. Next a "no-short" set is defined and subcells subA, subB, subC, and subD are placed in it. All the subcells are labeled as markable and subcells subA, subB are marked for exclusion in the connectivity analysis. The short is present in subcell subD so when examining the connectivity the short will still be present. Subcells subC and subD are markable and the method will mark them and remove the mark on subcells subA and subB making the unmarkable. When examining the connectivity of the shorted node there will now be no short so the method proceed to remove subA and subB from the "no-short" set and now subcell subC is marked for exclusion. There is still a short so subC is labeled unmarkable and subD is left marked. Now, the short is removed and the "no-short" set is left with subcell subD only. The method will stop and output the subcell subD as the one with the short.

Although the description above contains many specificities, these should not be construed as limiting the scope of the invention but as merely providing illustrations of some of the presently preferred embodiments of this invention. It is furthermore clear that many alternatives, modifications, variations, and uses will be apparent to those skilled in the art in light of the foregoing discussion. The scope of the invention should be determined by the appended claims and the legal equivalents, rather than by the examples given.

The invention claimed is:

1. A method of finding a plurality of unwanted connections, hereafter referred to as shorts, between different electrical nodes in a physical layout of an integrated circuit, said layout comprising polygons and other geometrical shapes, hereafter referred to as polygons, and other cells known as subcells being part of a hierarchical layout, said method comprising:
    (a) reading layout design;
    (b) marking a user defined selection of polygons known to said user to belong to same electrical nodes;
    (c) determining if layout is hierarchical;
    (d) if said layout is hierarchical then removing all subcells from said layout and determining if said shorts are still present
        (1) if said shorts are still present searching for said shorts among said polygons by repeatedly excluding polygons in different parts of said layout from the electrical connectivity analysis until the group of polygons causing said shorts is identified;
        (2) if said shorts are not present then searching for said shorts among the subcells by repeatedly excluding different subcells from the electrical connectivity analysis until the subcells causing said shorts are identified;
    (e) if said layout is not hierarchical searching for said shorts among said polygons by repeatedly excluding polygons in different parts of said layout from the electrical connectivity analysis until the group of polygons causing said shorts is identified;
whereby said shorts are found.

2. The method as set forth in claim 1 wherein searching for said shorts among said polygons by repeatedly excluding polygons in different parts of said layout from the electrical connectivity analysis until the group of polygons causing said shorts is identified comprises:
    (a) dividing the layout into exclusion regions;
    (b) setting the number of said exclusion regions to be active at a time to an initial value;
    (c) putting the exclusion regions in a unique no-short set;
    (d) marking a subset of the exclusion regions as active exclusion regions wherein said subset contains up to as many exclusion regions as can be active at a time;
    (e) checking for existence of said shorts in said layout ignoring any electrical interactions between polygons inside said active exclusion regions;
    (f) if said shorts exist then
        (1) if there are unexplored exclusion regions marking said active exclusion regions as explored and a subset of said unexplored exclusion regions as active and continue with (e);
        (2) if there are no unexplored exclusion regions investigating whether said exclusion regions can be redefined
            if said exclusion regions can be redefined, redefining said exclusion regions and continuing at step (d);
            if said exclusion regions cannot be redefined increase the number of exclusion regions to be active at a time
                if the number of exclusion regions to be active at a time is smaller than a certain limit mark all exclusion regions in said no-short set explorable and continue with (d);

if the number of exclusion regions to be active at a time is greater than said limit then output the location of said active exclusion regions;
(g) if said shorts do not exist then replacing the content in said no-short set with said active exclusion regions
if size of said active exclusion regions is smaller than a certain minimum then output the location of said regions in said no-short set;
if size of said active exclusion regions is not smaller than said minimum then dividing the active exclusion regions into smaller exclusion regions making them explorable and not active and continue from (d);
wherein said shorts among said polygons can be found within the location of said active exclusion regions in the output.

3. The method as set forth in claim 2 wherein setting the number of said exclusion regions to be active at a time to an initial value comprises setting the initial value to one.

4. The method as set forth in claim 2 wherein redefining exclusion regions comprises changing their physical coordinates.

5. The method as set forth in claim 1, wherein searching for shorts among subcells comprises:
(a) defining a no-short set;
(b) making all subcells part of the no-short set;
(c) labeling all subcells in the no-short set markable;
(d) marking some subcells in the no-short set;
(e) excluding said marked subcells from the electrical connectivity analysis;
(f) investigating if said shorts are still present;
(g) if said shorts are still present then finding out if there are markable subcells in the no-short set
if there are markable and unmarked subcells in the no-short set then mark a selection of said subcells and remove the mark of said marked subcells labeling said marked subcells unmarkable;
if there are no markable and unmarked subcells in the no-short set then output said marked subcells and exit;
(h) if said shorts are not present investigating whether there are unmarked subcells left
if there are unmarked subcells left then removing said unmarked subcells and continue with step (c);
if there are no unmarked subcells left then output marked subcells and exit;
wherein said shorts in subcells can be found within said marked subcells in the output.

6. An apparatus for finding a plurality of unwanted connections, hereafter referred to as shorts, between different electrical nodes in a physical layout of an integrated circuit, said layout comprising polygons and other geometrical shapes, hereafter referred to as polygons, and other cells known as subcells being part of a hierarchical layout, said apparatus comprising a Central Processing Unit memory and input/output means, said apparatus further comprising:
(a) input means for reading layout design;
(b) means for marking a user defined selection of polygons known to said user to belong to same electrical nodes;
(c) means for determining if layout is hierarchical;
(d) if said layout is hierarchical then means for removing all subcells from said layout and means for determining if said shorts are still present
(1) if said shorts are still present means for searching for said shorts among said polygons by repeatedly excluding polygons in different parts of said layout from the electrical connectivity analysis until the group of polygons causing said shorts is identified;
(2) if said shorts are not present then means searching for said shorts among the subcells by repeatedly excluding different subcells from the electrical connectivity analysis until the subcells causing said shorts are identified;
(e) if said layout is not hierarchical means for searching for said shorts among said polygons by repeatedly excluding polygons in different parts of said layout from the electrical connectivity analysis until the group of polygons causing said shorts is identified;
whereby said shorts are found.

7. The apparatus as set forth in claim 6 wherein means for searching for said shorts among said polygons by repeatedly excluding polygons in different parts of said layout from the electrical connectivity analysis until the group of polygons causing said shorts is identified comprises:
(a) means for dividing the layout into exclusion regions;
(b) means for setting the number of said exclusion regions to be active at a time to an initial value;
(c) means for putting the exclusion regions in a unique no-short set;
(d) means for marking a subset of the exclusion regions as active exclusion regions wherein said subset contains up to as many exclusion regions as can be active at a time;
(e) means for checking for existence of said shorts in said layout ignoring any electrical interactions between polygons inside said active exclusion regions;
(f) if said shorts exist then
(1) if there are unexplored exclusion regions means for marking said active exclusion regions as explored and a subset of said unexplored exclusion regions as active and continue with (e);
(2) if there are no unexplored exclusion regions means for investigating whether said exclusion regions can be redefined
if said exclusion regions can be redefined, means for redefining said exclusion regions and continuing at step (d);
if said exclusion regions cannot be redefined means to increase the number of exclusion regions to be active at a time
if the number of exclusion regions to be active at a time is smaller than a certain limit means to mark all exclusion regions in said no-short set explorable and continue with (d);
if the number of exclusion regions to be active at a time is greater than said limit then means to output the location of said active exclusion regions;
(g) if said shorts do not exist then means for replacing the content in said no-short set with said active exclusion regions
if size of said active exclusion regions is smaller than a certain minimum then means to output the location of said regions in said no-short set;
if size of said active exclusion regions is not smaller than said minimum then means for dividing the active exclusion regions into smaller exclusion regions and means for making them explorable and not active and continue from (d);
wherein said shorts among said polygons can be found within the location of said active exclusion regions in the output.

8. The apparatus as set forth in claim 7 wherein means for setting the number of said exclusion regions to be active at a time to an initial value comprises means for setting the initial value to one.

9. The apparatus as set forth in claim 7 wherein redefining exclusion regions comprises means for changing their physical coordinates.

10. The apparatus as set forth in claim 6, wherein means for searching for shorts among subcells comprises:

(a) means for defining a no-short set;
(b) means for making all subcells part of the no-short set;
(c) means for labeling all subcells in the no-short set markable;
(d) means for marking some subcells in the no-short set;
(e) means for excluding said marked subcells from the electrical connectivity analysis;
(f) means for investigating if said shorts are still present;
(g) if said shorts are still present then means for finding out if there are markable subcells in the no-short set
　if there are markable and unmarked subcells in the no-short set then means to mark a selection of said subcells and means to remove the mark of said marked subcells labeling said marked subcells unmarkable;
　if there are no markable and unmarked subcells in the no-short set then means to output said marked subcells and exit;
(h) if said shorts are not present means for investigating whether there are unmarked subcells left
　if there are unmarked subcells left then means for removing said unmarked subcells and continue with step (c);
　if there are no unmarked subcells left then means to output marked subcells and exit;

wherein said shorts in subcells can be found within said marked subcells in the output.

* * * * *